(12) United States Patent
Ojiri et al.

(10) Patent No.: US 6,288,346 B1
(45) Date of Patent: *Sep. 11, 2001

(54) SYSTEM AND METHOD FOR EASILY INSPECTING A BONDED STATE OF A BGA/CSP TYPE ELECTRONIC PART TO A BOARD

(75) Inventors: Hirofumi Ojiri; Takashi Yasumoto, both of Higashihiroshima (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,954

(22) Filed: Jun. 1, 1998

(30) Foreign Application Priority Data

Jul. 16, 1997 (JP) ............... 9-190899
Dec. 22, 1997 (JP) ............... 9-352713

(51) Int. Cl.$^7$ ............... H05K 1/16
(52) U.S. Cl. ............... 174/260; 174/261; 324/756; 324/765; 361/777
(58) Field of Search ............... 174/260, 261; 361/767, 777; 324/755, 756, 763, 765

(56) References Cited

U.S. PATENT DOCUMENTS

| 4,812,742 | 3/1989 | Abel et al. | 324/537 |
| 5,010,447 | 4/1991 | Wallace | 361/782 |

FOREIGN PATENT DOCUMENTS

| 0 571 963 A2 | 12/1999 | (EP) . |
| 62-274632 | * 11/1987 | (JP) . |
| 2-147868 | * 6/1990 | (JP) . |
| 4-155273 | * 5/1992 | (JP) . |
| A-7-234189 | 9/1995 | (JP) . |
| 8-29454 | * 2/1996 | (JP) . |
| A-9-127178 | 5/1997 | (JP) . |

* cited by examiner

Primary Examiner—Kamand Cuneo
(74) Attorney, Agent, or Firm—Nixon & Vanderhye P.C.

(57) ABSTRACT

In a BGA/CSP type electronic part having a matrix-shaped array of solder pads on its back surface, the solder pads at first two corners on one side of the array are connected with each other by an inner pattern wire, and the solder pads at the other, second two corners on the opposite side are also connected with each other by an inner pattern wire. In a printed wiring board having a matrix-shaped array of connection pads on its top surface, pattern wires are extended from the connection pads at four corners of the connection pad array to form test lands. Further, the connection pads, at two of the corners, to be bonded with the solder pads at one of the first two corners and at one of the second two corners confronting the one of the first two corners are connected with each other by a pattern wire on the board. Thus, after the BGA/CSP type electronic part is mounted in position on the printed wiring board, the state of the connection between the BGA/CSP type electronic part and the printed wiring board can be confirmed by checking the state of continuity between the test lands connected with the connection pads at the other two corners of the connection pad array.

9 Claims, 3 Drawing Sheets

SYSTEM AND METHOD FOR EASILY INSPECTING A BONDED STATE OF A BGA/CSP TYPE ELECTRONIC PART TO A BOARD

BACKGROUND OF THE INVENTION

The present invention relates to an assembly inspection system and method for examining the connected or bonded state of electronic parts of BGA (Ball Grid Array) type or CSP (Chip Scale/Size Package) type.

In recent years, in mounting an electronic part such as an LSI package on a substrate or board, a face bonding method is mainly adopted. BGA type electronic parts and CSP type electronic parts are typically face-bonding type electronic parts. Once an electronic part of the BGA type or that of the CSP type has been mounted in position, a soldered state thereof cannot be visually confirmed. In the process of assembling the board mounted with such a BGA type electronic part or a CSP type electronic part into an electronic equipment, there is a case in which it is impossible to decide whether an equipment failure is due to a defective connection of the BGA/CSP type electronic part or due to another cause. Thus, it is necessary to correctly inspect whether the BGA/CSP type electronic part is correctly bonded on the board. For this purpose, there is proposed an inspection system in which through-hole-provided pads are formed on a printed wiring board in correspondence with ball-shaped solder pads formed on a back surface of the BGA/CSP type electronic part, and in which the state of connection between the BGA/CSP type electronic part and the printed wiring board is inspected after the reflow process according to whether the through-hole-provided pads are filled with solder, as disclosed in Laid-Open Japanese Patent Publication No. 9-127178. Also, as disclosed in Laid-Open Japanese Patent Publication No.7-234189, there is proposed an inspection system utilizing a fine connection inspection device using a sensor.

However, in the former of the above two conventional inspection systems, it is necessary to form on the printed wiring board the through-hole-provided pads corresponding to the ball-shaped solder pads on the back surface of the BGA/CSP type electronic part. Thus, the degree of freedom in designing a pattern deteriorates, which prevents a fine pattern design. In the latter of the two conventional inspection systems, it is necessary to introduce an expensive inspection device and thus the manufacturing cost becomes substantially high.

SUMMARY OF THE INVENTION

It is therefore an object of the present invention to provide an assembly inspection system and method capable of inspecting a bonded or connected state of an electronic part of the BGA/ CSP type in a short period of time and at a low cost.

The present invention is applied to an assembly of an electronic part of the BGA/CSP type and a board wherein the electronic part has a plurality of solder pads on a surface thereof confronting the board, and the board has a plurality of connection pads to be bonded with the respective solder pads.

According to the present invention, wiring is extended on the board from each of at least two of the plurality of connection pads to thereby form at least two test lands on the board at locations which are not covered with the electronic part when mounted on the board. Then, an electrical path is formed which extends from each of the test lands to another via wiring of the electronic part and the wiring of the board. Then, a state of electrical connection is inspected between the test lands after bonding the electronic part to the board, to thereby inspect the bonded state between the electronic part and the board.

In an embodiment, the solder pads and the connection pads are arrayed in a matrix form, respectively, and the test lands are connected with the connection pads at four corners of the connection pad array, respectively. Preferably, the wiring of one of the electronic part and the board extends between the solder pads located at first two corners on one side of the solder pad array and between the solder pads located at the other, second two corners on the opposite side of the solder pad array. Also, the wiring of the other of the electronic part and the board extends between the connection pad corresponding to the solder pad located at one of the first two corners and the connection pad corresponding to the solder pad located at one of the second two corners confronting the one of the first two corners. With this arrangement, by inspecting the electrical connection condition between the test lands, an accurate inspection of the bonded state between the electronic part and the board is provided. Also, the position where a faulty connection, if any, has occurred, can be easily inspected.

In an embodiment, the board is formed with five or more test lands, four of which are connected with the connection pads at the four corners of the connection pad array, respectively, and the rest is connected with one or more selected among from the connection pads located in positions other than the four corners. With this arrangement, it is possible to inspect the bonded state between the board and each of the solder pads at the four corners of the electronic part.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1B:
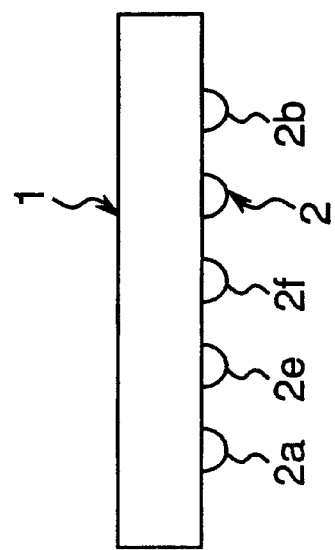
FIG. 1B is a side view of the BGA/CSP type electronic part of FIG. 1A.
Figure 1A:
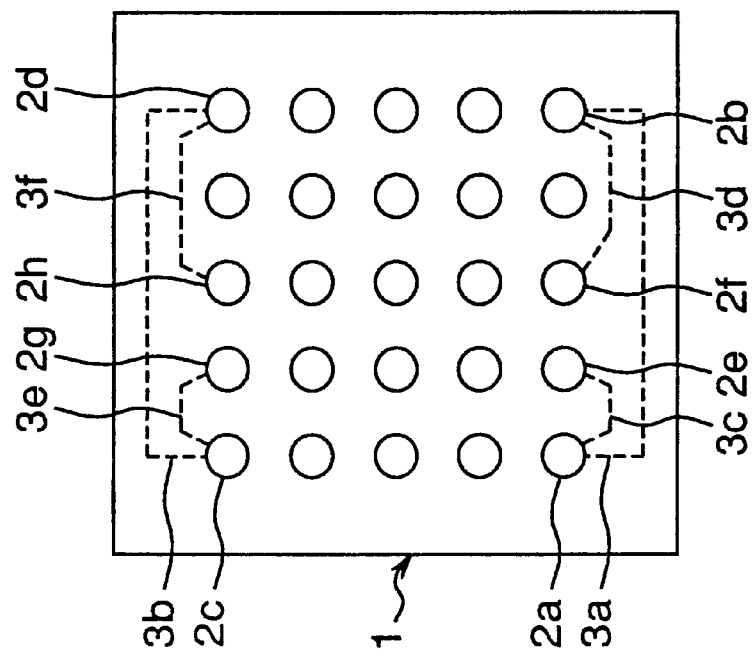
FIG. 1A is a rear surface view of a BGA/CSP type electronic part which is used in an assembly inspection system according to one embodiment of the present invention.

An assembly inspection system according to an embodiment of the present invention will be now described with reference to FIGS. 1A, 1B, 2, 3 and 4.

In FIGS. 1A through 4, reference numeral 1 denotes a BGA/CSP type electronic part having a plurality of ball-shaped solder pads (generally indicated by reference numeral 2) arrayed in a matrix form on its back surface. Of the solder pads 2a, 2b, 2c, and 2d at the four corners of the solder pad array, the solder pads 2a and 2b are connected with each other by an inner pattern wire 3a, and the solder pads 2c and 2d are connected with each other by an inner pattern wire 3b. Of the solder pads 2e, 2f, 2g, and 2h other than the solder pads positioned at the four corners, the solder pad 2e is connected with the solder pad 2a by an inner pattern wire 3c, the solder pad 2f is connected with the solder pad 2b by an inner pattern wire 3d, the solder pad 2g is connected with the solder pad 2c by an inner pattern wire 3e, and the solder pad 2h is connected with the solder pad 2d by an inner pattern wire 3f.

Figure 4:
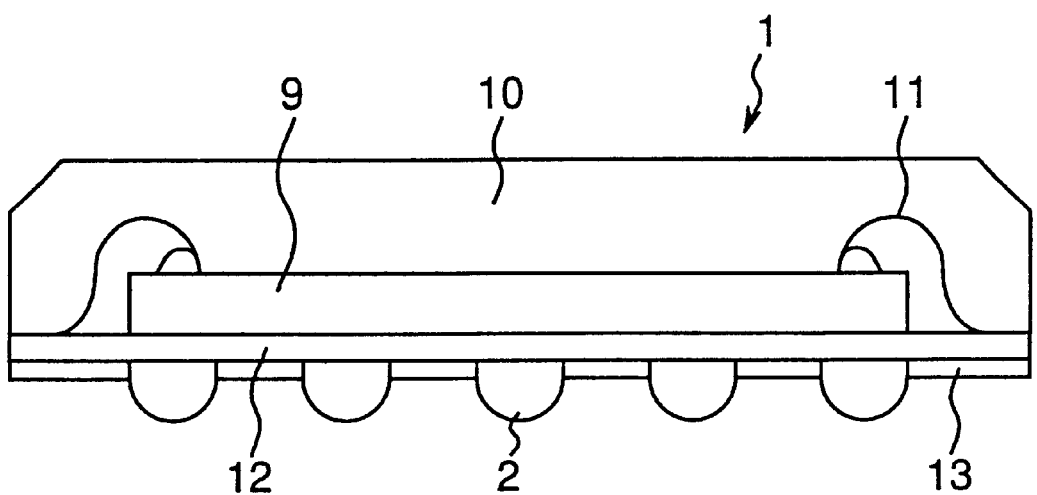
FIG. 4 is a sectional view showing the internal construction of the BGA/CSP type electronic part of FIG. 1A.

As shown in FIG. 4 wherein hatching is omitted for the sake of clarity and simplicity, the inner pattern wires 3 (including 3a–3f) of the BGA/CSP type electronic part 1 may be formed on an inner wiring board 12, or in an IC chip 9. Also, the inner pattern wires 3 on the inner wiring plate 12 or in the IC chip 9 may be connected with one another by using a wire 11. When it is difficult to form the inner pattern wires 3 on the inner wiring board 12, the inner pattern wires 3 are realized by forming pattern wires inside the IC chip 9 and then connecting the IC chip 9 with the inner wiring board 12 by the wire 11. In FIG. 4, the wire 11 is shown connecting the IC chip 9 with the inner wiring board 12. Reference numeral 10 denotes sealing resin of the BGA/SCP type electronic part 1, and reference numeral 13 denotes solder resist.

Figure 2:
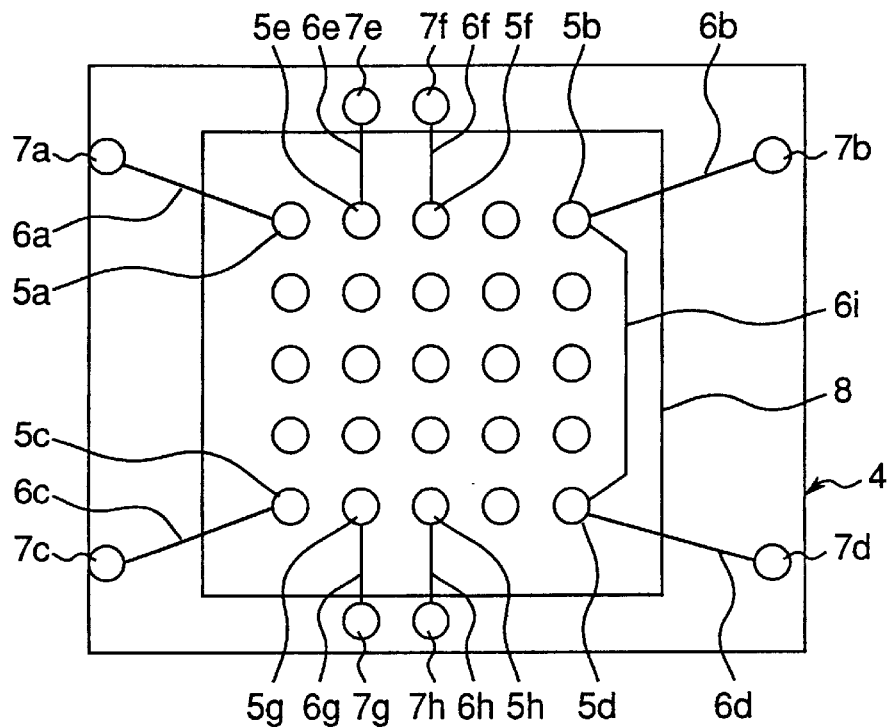
FIG. 2 is a plan view showing a top surface of a printed wiring board which is used in the assembly inspection system of the present invention.
Figure 3:
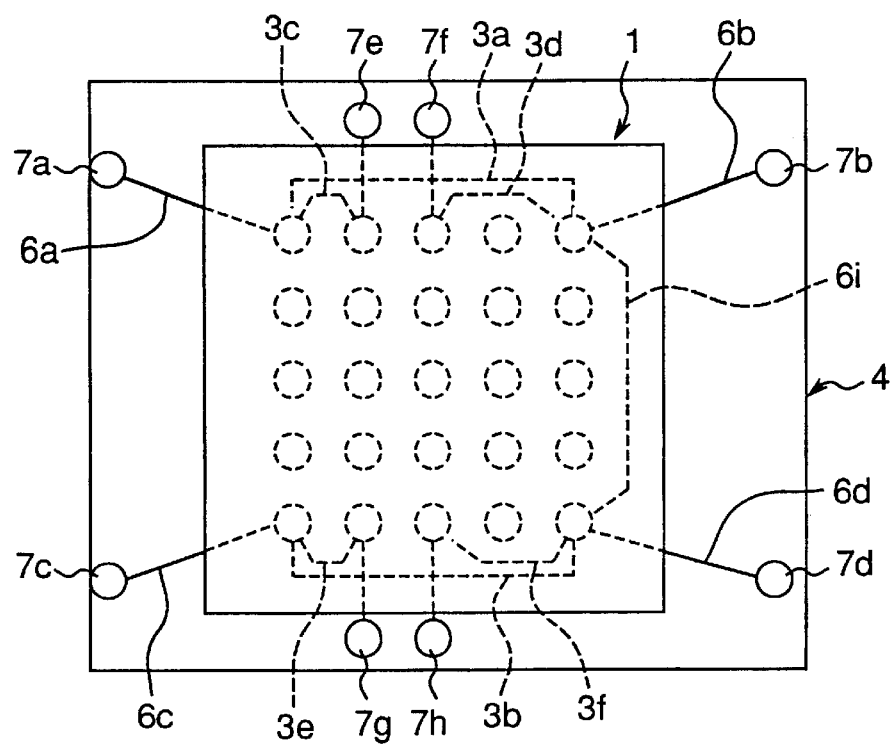
FIG. 3 is a plan view showing a state in which the BGA/CSP type electronic part of FIG. 1A has been mounted on the printed wiring board of FIG. 2.

Referring now to FIGS. 2 and 3, reference numeral 4 denotes a printed wiring board having connection pads 5 (including ones 5a–5h) on its bonding face thereof. These connection pads 5 are also arrayed in a matrix form in correspondence with the solder pads 2 of the electronic part 1. Pattern wires 6a, 6b, 6c, 6d, 6e, 6f, 6g, and 6h are extended outwardly from the respective connection pads 5a, 5b, 5c, 5d, 5e, 5f, 5g, and 5h corresponding to the respective solder pads 2a, 2b, 2c, 2d, 2e, 2f, 2g, and 2h to form test lands 7a, 7b, 7c, 7d, 7e, 7f, 7g, and 7h at positions where the test lands are exposed after the BGA/SCP type electronic part 1 is mounted in position on the printed wiring board 4. The connection pads 5b and 5d are connected with each other by a pattern wire 6i. Reference numeral 8 denotes a silking indication showing the contour of the BGA/SCP type electronic part 1 on the printed wiring board 4. The silking indication 8 is used as a guide in mounting the BGA/SCP type electronic part 1.

With the above arrangement, it is possible to confirm the state of the connection between the BGA/SCP type electronic part 1 and the printed wiring board 4 by checking the state of continuity between the test lands 7a and 7c using an appropriate device such as a continuity checker or a simple circuit tester. Further, it is possible to know a faulty electric conductive position, if any, by checking the state of continuity between the test lands 7a and 7d, between the test lands 7a and 7b, between the test lands 7d and 7b, and between the test lands 7d and 7c. Furthermore, it is possible to confirm the state of connection between the printed wiring board 4 and each of the solder pads 2a, 2b, 2c, and 2d positioned at the four corners of the solder pad array of the BGA/SCP type electronic part 1 by checking state of continuity between the test lands 7a and 7e, between the test lands 7b and 7f, between the test lands 7c and 7g, and between the test lands 7d and 7h.

The electric connection states at the four corners of the BGA/SCP type electronic part 1 are inspected in this embodiment because, when a mechanical stress or a thermal stress is applied to an assembly of the BGA/SCP type electronic part 1 and the printed wiring board 4, defective connections tend to occur largely between the solder pads 2a, 2b, 2c, and 2d at the four corners of the BGA/SCP type electronic part 1 and the printed wiring board 4; between the inner pattern wires of the BGA/SCP type electronic part 1 and the solder pads 2a, 2b, 2c, and 2d at the four corners thereof; and between the pattern wires 3 and the connection pads 5a, 5b, 5c, and 5d, formed on the printed wiring board 4, corresponding to the solder pads 2a, 2b, 2c, and 2d at the four corners of the BGA/SCP type electronic part 1. Inspection positions, however, are not limited to the four corners of the BGA/SCP type electronic part 1, and the state of connection between the BGA/SCP type electronic part 1 and the printed wiring board 4 may be confirmed by inspecting the electric connection states at other positions.

Furthermore, in the above embodiment, in addition to the test lands 7a, 7b, 7c, and 7d connected through the extended pattern wires 6e, 6f, 6g and 6h with the connection pads 5a, 5b, 5c and 5d corresponding to the solder pads 2a, 2b, 2c and 2d at the four corners of the BGA/SCP type electronic part 1, the printed wiring board 4 is formed with the test lands 7e, 7f, 7g, and 7h which are connected through the extended pattern wires 6e, 6f, 6g, and 6h with the connection pads 5e, 5f, 5g, and 5h corresponding to the solder pads 2e, 2f, 2g, and 2h not located at the four corners of the BGA/SCP type electronic part 1. Then, using the combinations of the test lands 7a and 7e, the test lands 7b and 7f, the test lands 7c and 7g, and the test lands 7d and 7h, the connected or bonded state between each of the solder pads 2a, 2b, 2c, and 2d positioned at the four corners of the BGA/SCP type electronic part 1 and the printed wiring board 4 is inspected. But the inspection method is not limited to this method. For example, only the test land 7e may be formed, and the connection pad 5e corresponding to the test land 7e may be connected with each of the connection pads 5a, 5b, 5c, and 5d with the pattern wire 6 or the inner pattern wire 3. Then, the connection between the solder pads 2a, 2b, 2c, and 2d positioned at the four corners of the BGA/SCP type electronic part 1 and the printed wiring board 4 is inspected by combining the test land 7e and each of the test lands 7a–7d. Also, it will be easily understood that two test lands are enough to simply examine whether or not the electronic part 1 is well connected with the printed wiring board 4.

As is obvious from the above, according to the present invention, the connected or bonded state of the electronic part to the substrate or board is inspected by inspecting the state of electrical connection between the test lands. Therefore, without using an inspection device having a complicated construction, on-line inspections can be accomplished on a mass production line by using a device having a simple construction such as a continuity checker. Further, when there is a possibility that the connection between the electronic part and the substrate becomes defective due to a mechanical stress or a thermal stress applied thereto after the electronic part and the substrate are assembled into an electronic equipment, a defective connection state thereof is easily detected by inspecting the state of continuity between the test lands.

Furthermore, according to the present invention, the position where a defective connection has occurred is easily detected by inspecting the state of electric connection between the test lands. Also, it is possible to inspect the bonded state between the substrate and each of the solder pad positioned at the four corners of the electronic part by inspecting the state of electric connection between the test lands. Therefore, the bonded state between the electronic part and the substrate can be correctly recognized and thus a countermeasure can be taken promptly and accurately.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An assembly inspection system for inspecting a bonded state between a board and an electronic part mounted on the board, wherein the electronic part has a plurality of solder pads on a surface thereof confronting said board, and the board has an arrangement of a plurality of connection pads to be bonded with the respective solder pads, comprising:

at least two test lands formed on said board at locations which are not covered with said electronic part mounted on said board, each of said test lands being electrically connected with a corresponding one of said plurality of connection pads, wherein said connection pads electrically connected to said at least two test lands are at opposite corners of said arrangement of the plurality of connection pads;

an electrical path extending between said at least two test lands at opposite corners of the arrangement via wiring of said electronic part and wiring of said board; and a connection on said on each of the at least two test lands at opposite corners for connection to an inspection station connectable to said test lands to thereby inspect the bonded state between said electronic part and said board.

2. The assembly inspection system according to claim 1, wherein said test lands are connected with the corresponding connection pads by the wiring formed on the board and extending from each of the corresponding connection pads.

3. The assembly inspection system according to claim 1, wherein said solder pads and said connection pads are arrayed in a matrix form, respectively; and said test lands are connected with the connection pads at four corners of the connection pad array, respectively.

4. The assembly inspection system according to claim 3, wherein the wiring of one of said electronic part and said board extends between the solder pads located at first two corners on one side of the solder pad array and between the solder pads located at the other, second two corners on the opposite side of the solder pad array; and the wiring of the other of said electronic part and said board extends between the connection pad corresponding to the solder pad located at one of said first two corners and the connection pad corresponding to the solder pad located at one of said second two corners confronting said one of said first two corners.

5. The assembly inspection system according to claim 1, wherein said solder pads and said connection pads are arrayed in a matrix form, respectively; and said system has totally five or more test lands, four of which are connected with the connection pads at four corners of the connection pad array, respectively.

6. An assembly inspection method for inspecting a bonded state between a board and an electronic part mounted on the board, wherein the electronic part has a plurality of solder pads on a surface thereof confronting said board, and the board has an arrangement of a plurality of connection pads to be bonded with the respective solder pads, comprising the steps of:

extending wiring on said board from each of at least two of said plurality of connection pads to thereby form at least two test lands on said board at locations which are not covered with said electronic part when mounted on said board, where said two of said plurality of connection pads are at opposite corners of said arrangement of said plurality of connection pads;

forming an electrical path extending between said test lands connected to connection pads at opposite corners of said arrangement via wiring of said electronic part and the wiring of said board; and inspecting a state of electrical connection between said test lands connected to connection pads at opposite corners of said arrangement after bonding said electronic part to said board, to thereby inspect the bonded state between said electronic part and said board.

7. The assembly inspection method according to claim 6, wherein the solder pads and the connection pads are arrayed in a matrix form, respectively; and the step of extending wiring comprises extending wiring of the board from each of the connection pads positioned at least at the four corners of the connection pad array.

8. The assembly inspection method according to claim 7, wherein the step of forming an electrical path comprising:

connecting the solder pads located at first two corners on one side of the solder pad array with each other by means of wiring of one of the electronic part and the board;

connecting the solder pads located at the other, second two corners on the opposite side of the solder pad array with each other by means of wiring of the one of the electronic part and the board; and connecting the connection pad corresponding to the solder pad located at one of the first two corners with the connection pad corresponding to the solder pad located at one of the second two corners confronting the one of the first two corners by means of wiring of the other of the electronic part and the board.

9. The assembly inspection method according to claim 7, wherein the step of extending wiring comprises extending wiring of the board from each of the connection pads positioned at the four corners and also from one or more selected among from the connection pads located in positions other than the four corners so as to form five or more test lands.

* * * * *